United States Patent
Viss

(10) Patent No.: US 11,821,920 B1
(45) Date of Patent: Nov. 21, 2023

(54) SYSTEM AND METHOD FOR REDUCING ERROR IN TIME DOMAIN WAVEFORM OF A SIGNAL UNDER TEST (SUT)

(71) Applicant: Keysight Technologies, Inc., Santa Rosa, CA (US)

(72) Inventor: Marlin E. Viss, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/178,691

(22) Filed: Feb. 18, 2021

(51) Int. Cl.
*G01R 13/02* (2006.01)
*G01R 1/04* (2006.01)

(52) U.S. Cl.
CPC ....... *G01R 13/0272* (2013.01); *G01R 1/0408* (2013.01); *G01R 13/0254* (2013.01); *G01R 13/029* (2013.01)

(58) Field of Classification Search
CPC .............. G01R 13/0272; G01R 1/0408; G01R 13/0254; G01R 13/029
USPC .......................................................... 702/66
See application file for complete search history.

(56) References Cited

U.S. PATENT DOCUMENTS

| | | | |
|---|---|---|---|
| 7,339,509 B2 | 3/2008 | Woodward et al. | |
| 8,332,172 B2 | 12/2012 | Agoston et al. | |
| 9,985,812 B1 | 5/2018 | Hollender | |
| 11,255,893 B2 | 2/2022 | Draving | |
| 11,604,213 B1 * | 3/2023 | Draving | G01R 13/029 |
| 2005/0238094 A1 | 10/2005 | Bessho et al. | |
| 2014/0100822 A1 * | 4/2014 | Hiltner | G01R 13/029 |
| | | | 702/189 |
| 2020/0064386 A1 | 2/2020 | Draving | |
| 2021/0270877 A1 | 9/2021 | Owen | |
| 2022/0082603 A1 | 3/2022 | Draving | |
| 2022/0082604 A1 | 3/2022 | Draving | |

FOREIGN PATENT DOCUMENTS

| | | |
|---|---|---|
| CN | 105102992 A1 | 11/2015 |
| CN | 105657434 B | 3/2019 |

OTHER PUBLICATIONS

English translation of CN105657434B, 12 pgs.
Jason Breitbarth, "Cross Correlation in Phase noise analysis," Microwave Journal, Feb. 2011, pp. 78-85.

(Continued)

*Primary Examiner* — Michael P Nghiem

(57) ABSTRACT

A method and system provide for measuring a repeating waveform of a SUT. The method includes repeatedly sampling first and second copies of the SUT to provide first SUT waveforms including first noise introduced by a first digitizer and second SUT waveforms including second noise introduced by a second digitizer; pairing the first and second SUT waveforms to provide corresponding pairs of first and second digital samples; organizing the pairs of first and second digital samples into groups of sample pairs corresponding to sampling times; for each group, calculating a covariance of the first and second digital samples to estimate a signal variance of the SUT, and scaling the first and second digital samples to preserve a mean of the group while adjusting a variance of the group to match the estimated signal variance of the SUT at the corresponding sampling time; and reassembling the groups into the SUT waveform.

19 Claims, 4 Drawing Sheets

(56) References Cited

OTHER PUBLICATIONS

English Abstract of CN105102992, 2015,1 pg.
Non-Final Office Action dated Jul. 6, 2022, for U.S. Appl. No. 17/084,232, 20 pgs.
Notice of Allowance dated Dec. 19, 2022, U.S. Appl. No. 17/084,232, 20 pgs.
Supplemental Notice of Allowability dated Feb. 15, 2023, U.S. Appl. No. 17/084,232, 4 pgs.

* cited by examiner

SYSTEM AND METHOD FOR REDUCING ERROR IN TIME DOMAIN WAVEFORM OF A SIGNAL UNDER TEST (SUT)

BACKGROUND

Oscilloscopes and other test instruments that include digitizers generally measure signals in the time domain, providing voltage versus time waveforms for analysis or subsequent post-processing. However, such test instruments contribute random noise and other spurious distortions, particularly during the digitization process, that reduce quality of the measured signal under test (SUT) waveform. Noise and distortion are natural limitations of digitizers, so there have been numerous attempts to improve physical parametric performance of digitizers driven by the desire for lower digitizer error.

The most common technique used for reducing noise and distortion in digitized signals is averaging. This technique acquires multiple occurrences of the SUT and averages them together. Averaging requires that each acquisition of the waveform be strictly periodic and have the same exact waveshape. However, there is a class of signals for which averaging does not work because they are comprised of multiple additive components that are not phase-coherent relative to one another. These signals may be referred to as pseudo-periodic time-domain waveforms. One example of a pseudo-periodic time-domain waveform is a periodic serial data signal that is distorted by crosstalk from a different periodic serial data signal. It is desirable to remove the digitizer noise from the measurement of this signal, preserving both the primary serial data signal component of the signal and its crosstalk component.

One conventional technique for lowering digitizer error for this class of signal includes splitting the SUT into multiple copies, which are then routed to multiple independent digitizers. The output waveforms of these multiple digitizers are then averaged together to produce a single error-reduced waveform. However, this technique is limited to only averaging waveforms that were acquired simultaneously. It cannot average waveforms acquired at different instances of time, even if the input waveform is periodic. Large amounts of error reduction require a large number of digitizers. Also, there are practical limits to the number of times the signal can be split. With each additional split, the signal amplitude is reduced. The signal can be amplified, but amplification introduces additional noise and distortion.

Another similar noise reduction technique employs oversampling, or sampling the input signal at a much higher sample rate than is otherwise necessary. Oversampling followed by low-pass filtering effectively averages multiple samples from the same digitizer together, as opposed to averaging multiple samples from different digitizers together. The amount of noise reduction that can be achieved by the oversampling technique depends on the digitizer's noise spectral density and the error's correlation between adjacent samples. Large amounts of noise reduction require large sample rates.

Another technique attempts to construct a representative model of the digitized waveform that is comprised of multiple independent components, of which some of these components represent the digitizer's noise and distortion. The resultant error-reduced waveform is then reconstructed from this waveform model while excluding the digitizer noise and distortion components. The signal modeling technique is limited by the algorithm's inability to create an accurate (not overly simplified) model of the digitized SUT.

In addition, some techniques do not work well when noise statistics of the SUT are not consistent throughout the waveform. For example, in the case of an optical modulated signal, the noise of the one level is typically larger than the noise of the zero level. Inconsistent noise statistics may also be present where the waveform is acquired by an equivalent-time oscilloscope and contains significant jitter. This jitter would appear on a sampling oscilloscope waveform as increased noise wherever the slope of the signal is not zero.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
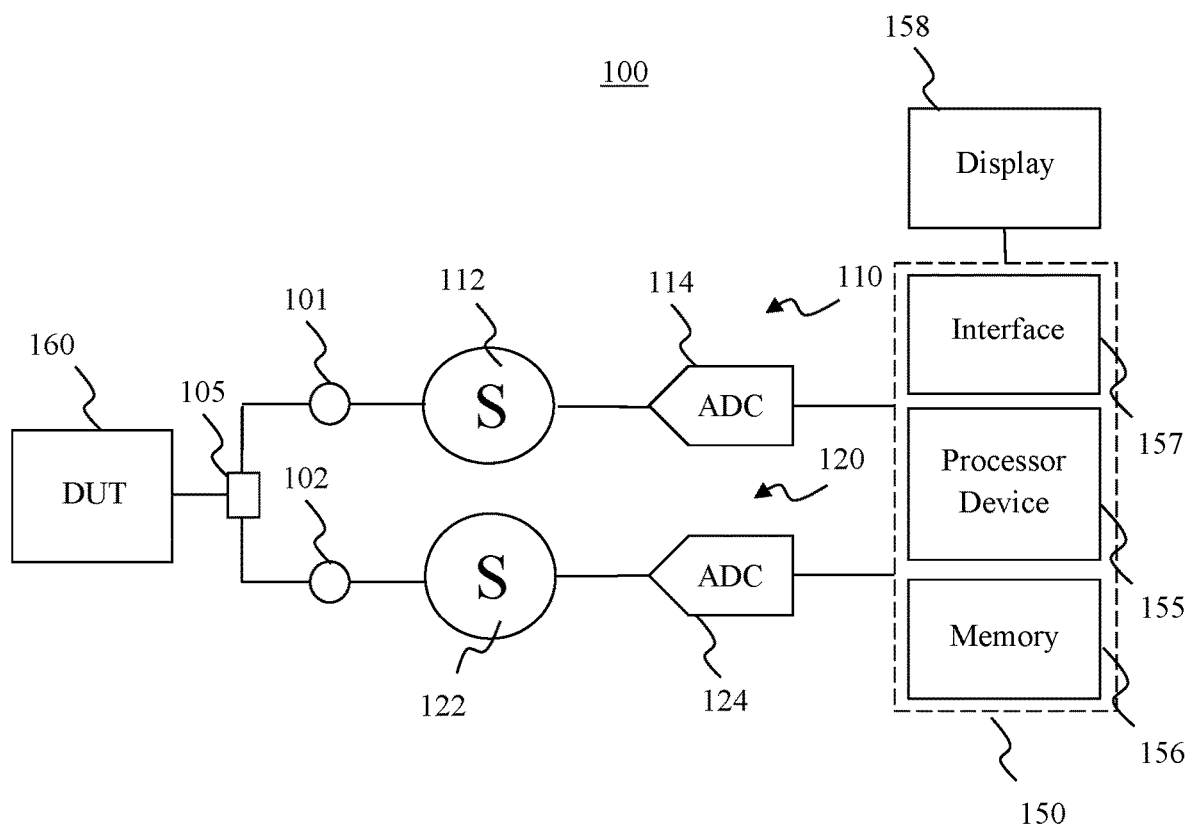
FIG. 1 is a simplified block diagram of a test system for making measurements of a SUT without uncorrelated noise, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to a representative embodiment, a method is provided for measuring in the time domain a waveform of a signal under test (SUT) with reduced error, the SUT waveform having a repeating waveform pattern. The method includes repeatedly sampling a first copy of the SUT at a first digitizer to provide multiple first SUT waveforms including first noise introduced by the first digitizer, where each first SUT waveform includes first digital samples; repeatedly sampling a second copy of the SUT at a second digitizer to provide multiple second SUT waveforms including second noise introduced by the second digitizer, where each second SUT waveform includes second digital samples, and the first noise and the second noise are uncorrelated; pairing the first SUT waveforms with the second SUT waveforms, respectively, according to the repeating waveform pattern to provide corresponding pairs of first and second digital samples; organizing the pairs of first and second digital samples into groups of sample pairs corresponding to respective sampling times within the repeating waveform pattern, respectively; for each group of sample pairs, calculating a covariance of the first and second digital samples to estimate a desired signal variance of the SUT at the corresponding sampling time of the group; for each group of sample pairs, scaling the first and second digital samples to preserve a mean of the group while adjusting a variance of the group to match the estimated desired signal variance of the SUT at the corresponding sampling time of the group; assembling the groups of sample pairs with the adjusted variances of the groups into a reassembled waveform of the SUT, without the first and second noise; and outputting the reassembled SUT waveform as a noise reduced measurement of the SUT.

According to another representative embodiment, a system is provided for measuring in the time domain a waveform of a SUT with reduced error, the SUT waveform having a repeating waveform pattern. The system includes a first channel configured to receive a first copy of the SUT, the first channel including a first analog to digital converter (ADC) configured to repeatedly sample the first copy of the SUT to provide multiple first SUT waveforms including first noise introduced by the first ADC, where each first SUT waveform includes first digital samples; a second channel configured to receive a second copy of the SUT, the second channel including a second ADC configured to repeatedly sample the second copy of the SUT to provide multiple second SUT waveforms including second noise introduced by the second ADC, where each second SUT waveform includes second digital samples, and the first noise and the second noise are uncorrelated. The system further includes a processor and a memory for storing instructions that, when executed by the processor, cause the processor to pair the first SUT waveforms with the second SUT waveforms, respectively, according to the repeating waveform pattern to provide corresponding pairs of first and second digital samples; organize the pairs of first and second digital samples into groups of sample pairs corresponding to respective sampling times within the repeating waveform pattern, respectively; for each group of sample pairs, calculate a covariance of the first and second digital samples to estimate a desired signal variance of the SUT at the corresponding sampling time of the group; for each group of sample pairs, scale the first and second digital samples to preserve a mean of the group while adjusting a variance of the group to match the estimated desired signal variance of the SUT at the corresponding sampling time of the group; assemble the groups of sample pairs with the adjusted variances of the groups into a reassembled waveform of the SUT, without the first and second noise; and output the reassembled SUT waveform as a noise reduced measurement of the SUT.

According to another representative embodiment, a method is provided for measuring in the time domain a waveform of a SUT with reduced error, the waveform having a repeating waveform pattern. The method includes characterizing noise of a digitizer; repeatedly sampling the SUT at the digitizer to provide multiple digital samples including noise introduced by the digitizer during the sampling; and organizing the digital samples into groups corresponding to sampling times within the repeating waveform pattern. For each group of the digital samples, the method further includes calculating a variance of the SUT at the corresponding sampling time of the group; subtracting a known noise variance, corresponding to the noise introduced by the digitizer, from the calculated SUT variance to determine a desired signal variance of the SUT, where the known noise variance is derived from the characterized noise of the digitizer; and scaling the digital samples to preserve a mean of the group while adjusting a group signal variance to match the desired signal variance of the SUT at the corresponding sampling time of the group. The method further includes assembling the groups of the digital samples with the adjusted group signal variances as a reassembled SUT waveform, without the noise introduced by the digitizer; and outputting the reassembled SUT waveform as a noise reduced measurement of the SUT.

FIG. 1 is a simplified block diagram of a test system for making measurements of a SUT, according to a representative embodiment. While making the measurements, error is introduced to the SUT by the test system, including correlated error that originates in a source common to both input channels, such as a common clock or timebase, and uncorrelated error (uncorrelated noise) that originates in a source specific to one of the input channels, such as in a corresponding digitizer. In order to provide an accurate digitized waveform of the SUT for making accurate measurements or observations, the noise introduced by the input channels, including uncorrelated noise, must be minimized or removed from the SUT in order to provide accurate signal measurements and displays.

Referring to FIG. 1, test system 100 may be an oscilloscope or a digital communication analyzer (DCA), for example, having multiple input channels, indicated by representative first input channel 110 and second input channel 120, although additional input channels may be included without departing from the scope of the present teachings. In an embodiment, the oscilloscope may be an equivalent-time (sampling) oscilloscope, although alternative embodiments may include a real-time oscilloscope, without departing from the scope of the present teachings. The first input channel 110 includes first port 101, first sampler 112 and first ADC 114, and the second input channel 120 includes second port 102, second sampler 122 and second ADC 124. Generally, the first and second samplers 112 and 122 covert high bandwidth signals to low bandwidth signals that can be digitized by the first and second ADCs 114 and 124, respectively, which may be referred to as sampling. The test system 100 receives a SUT output by a DUT 160 at the first and second ports 101 and 102, where the SUT may be generated by the DUT 160 or output by the DUT 160 in response to a stimulus signal. The test system 100 further includes a processing unit 150 for processing the SUT, performing various measurements, displaying the SUT and/or measurement results, and controlling the processes performed by the test system 100, as discussed below.

In the depicted embodiment, the SUT output by the DUT 160 is split by an RF splitter 105 or a diplexer (not shown), for example, into first and second copies of the SUT input to the first and second input channels 110 and 120, respectively. The first ADC 114 repeatedly samples the first copy of the SUT to provide multiple first SUT waveforms including first digital samples. The second ADC 124 repeatedly samples the second copy of the SUT to provide multiple second SUT waveforms including second digital samples. The first and second SUT waveforms may be digitized pseudo-periodic time-domain waveforms, which may be referred to as a repeating waveform pattern, where "pseudo-periodic" refers to time-domain signals that are comprised of multiple periodic components that are not necessarily strictly harmonically related. An example of a pseudo-periodic SUT is a periodic serial data signal that is distorted by an additive periodic switching power supply glitch. Both components of this SUT are independently periodic, but are not strictly synchronous with each other.

The first SUT waveforms include first noise introduced by the first ADC 114 during digitization, and the second SUT waveforms include second noise introduced by the second ADC 124 during digitization. The first and second noise may also be introduced by other components of the first and second channels, respectively, including the first and second samplers 112 and 122. Since the first noise is unique to the first input channel 110 and the second noise is unique to the second input channel 120, the first noise and the second noise are uncorrelated. The first and second ADCs 114 and 124 may be synchronized using a common time base, or first and second ADCs 114 and 124 may have independent time bases that are synchronized with one another. Notably, noise introduced by the common time base, for example, would be correlated noise.

When the SUT is a single-ended signal, the first and second copies of the SUT may be obtained by splitting the SUT, as shown in FIG. 1. When the SUT is a differential signal, the first and second copies of the SUT, respectively digitized in the first and second input channels 110 and 120, may correspond to inverted and non-inverted sides of the differential signal, for convenience, although this removes the common-mode rejection that a differential receiver may otherwise provide. Alternatively, both the inverted and non-inverted sides of the differential signal could be split and all four signals digitized. Or, the differential signal may be converted to a single-ended signal by a differential receiver and then split into the first and second copies provided to the two input channels, as discussed above. Two differential probes can even be used to double-probe a differential signal, providing two copies of the SUT to separate digitizing input channels.

The first and second digital signals are provided to the processing unit 150 for additional processing and display. For example, for each group of sample pairs, the processing unit 150 may calculate a covariance of the first and second digital samples to estimate a corresponding signal variance of the SUT at the respective sampling time of the groups, and scale the first and second digital samples to preserve a mean of the group while adjusting a variance of the group to match the estimated signal variance of the SUT at the corresponding sampling time of the group, as discussed below with reference to FIG. 2. Also, when using a single ADC for which noise has been characterized, the processing unit 150 may calculate a variance of the SUT at the sampling time of each group; subtract a known noise variance corresponding to the noise introduced by the first ADC 114 (or the second ADC 124) to determine a signal variance of the SUT; and scale the digital samples to preserve a mean of the group while adjusting a group signal variance to match the determined signal variance of the SUT at the corresponding sampling time of the group, as discussed below with reference to FIG. 4.

The processing unit 150 includes a processor 155, memory 156, and an interface 157, for example, and interface with a display 158. The processor 155, together with the memory 156, implements the methods of making time domain measurements of a wideband RF signal, and may be configured to perform and/or control all or a portion of the steps of the processes shown in FIGS. 2 and 4, discussed below. In various embodiments, the processor 155 may include one or more computer processors, digital signal processors (DSPs), field-programmable gate arrays (FPGAs), application specific integrated circuits (ASICs), or combinations thereof, using any combination of hardware, software, firmware, hard-wired logic circuits, or combinations thereof. The processor 155 may include its own processing memory (e.g., memory 156) for storing computer readable code (e.g., software, software modules) that enables performance of the various functions described herein. For example, the memory 156 may store software instructions/computer readable code executable by the processor 155 (e.g., computer processor) for performing some or all aspects of methods described herein.

References to the processor 155 may be interpreted to include one or more processing cores, as in a multi-core processor. The processor 155 may also refer to a collection of processors within a single computer system or distributed among multiple computer systems, as well as a collection or network of computing devices each including a processor or processors. Programs have software instructions performed by one or multiple processors that may be within the same computing device or which may be distributed across multiple computing devices.

The processing memory, as well as other memories and databases, are collectively represented by the memory 156, and may be random-access memory (RAM), read-only memory (ROM), flash memory, electrically programmable read-only memory (EPROM), electrically erasable and programmable read only memory (EEPROM), registers, a hard disk, a removable disk, tape, compact disk read only memory (CD-ROM), digital versatile disk (DVD), registers, a hard disk, a removable disk, tape, floppy disk, blu-ray disk, or universal serial bus (USB) driver, or any other form of storage medium known in the art, which are tangible and non-transitory storage media (e.g., as compared to transitory propagating signals). Memories may be volatile or non-volatile, secure and/or encrypted, unsecure and/or unencrypted, without departing from the scope of the present teachings. As mentioned above, the memory 156 is representative of one or more memories and databases, including the processing memory, as well as multiple memories and databases, including distributed and networked memories and databases.

The interface 157 may include a user interface and/or a network interface for providing information and data output by the processor 155 and/or the memory 156 to the user and/or for receiving information and data input by the user. That is, the interface 157 enables the user to enter data and to control or manipulate aspects of the process of measuring RF signals, and also enables the processor 155 to indicate the effects of the user's control or manipulation. The interface 157 may include one or more of ports, disk drives, wireless antennas, or other types of receiver circuitry. The interface 157 may further connect one or more user interfaces, such as a mouse, a keyboard, a mouse, a trackball, a joystick, a microphone, a video camera, a touchpad, a touchscreen, voice or gesture recognition captured by a microphone or video camera, for example, or any other peripheral or control to permit user feedback from and interaction with the processing unit 150.

The display 158 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 158 and/or the processor 155 may include one or more display interface(s), in which case the display 158 may provide a graphical user interface (GUI) for displaying and receiving information to and from a user.

Figure 2:
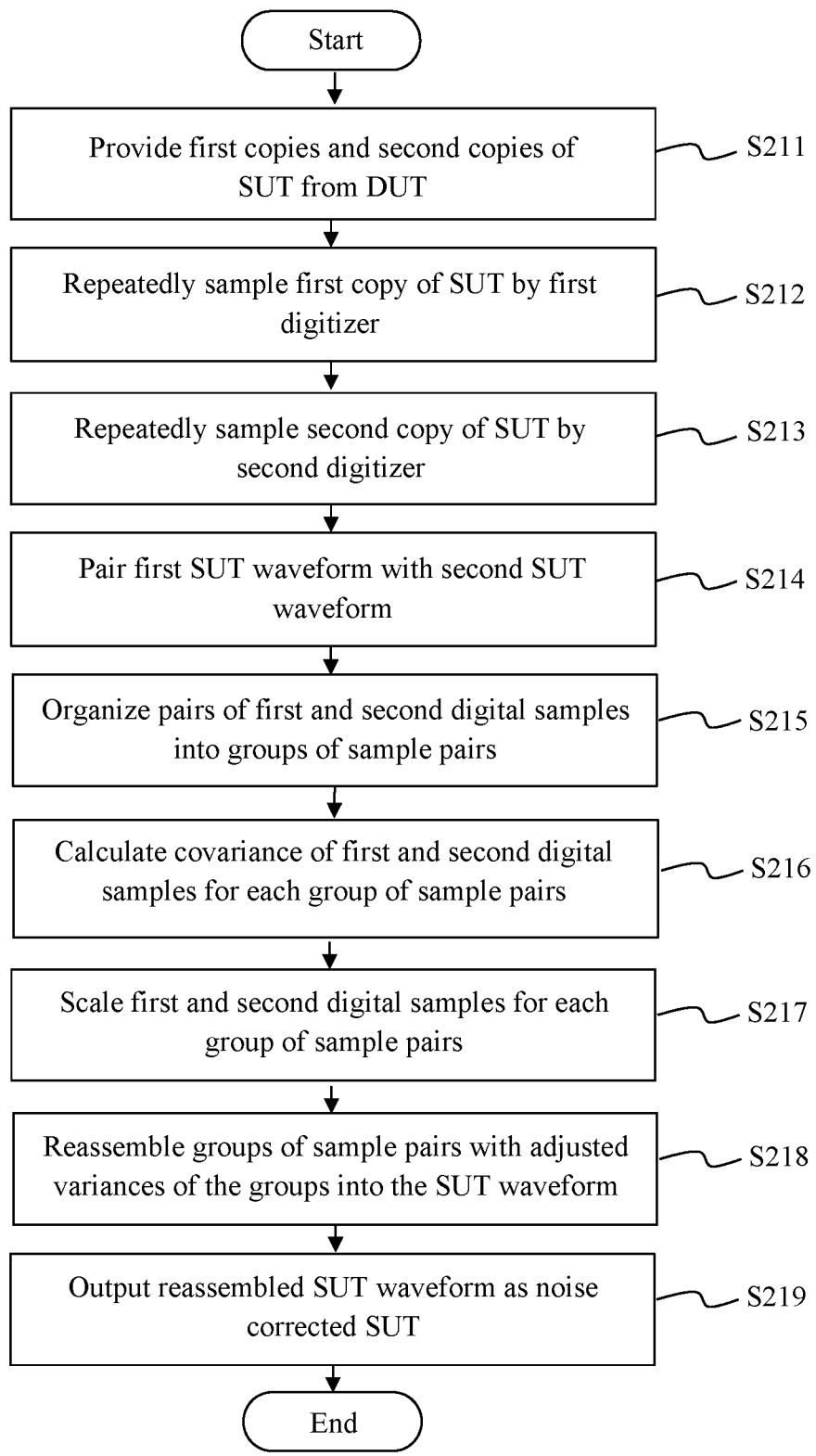
FIG. 2 is a flow diagram illustrating a method of measuring a waveform of a SUT with reduced error in the time domain, according to a representative embodiment.

FIG. 2 is a flow diagram illustrating a method of measuring a waveform of a SUT with reduced error in the time domain, according to a representative embodiment. The method may be implemented by the processing unit 150, for example, where the method steps are provided as instructions stored in the memory 156 and executable by the processor 155. The SUT has a repeating waveform pattern (pseudo-periodic time-domain waveform).

Referring to FIG. 2, first and second copies of the SUT are provided in block S211. The first copy of the SUT is input to a first input channel, and the second copy of the SUT is input to a second input channel. The SUT has a repeating waveform output by a DUT, where the DUT may generate the SUT or output the SUT in response to an input stimulus signal. The first and second copies of the SUT may be provided by splitting the SUT, using an RF splitter or diplexer, for example. When the SUT is a differential signal, the first and second copies of the SUT may be inverted and non-inverted sides of the SUT. Alternatively, the differential signal may be converted to a single-ended signal by a differential receiver and then split into the first and second copies of the SUT. Two differential probes can even be used to double-probe a differential signal, providing two copies of the SUT to separate digitizing input channels. Also, the first and second copies of the SUT may be identical, separately generated signals.

In block S212, the first copy of the SUT is repeatedly sampled by a first digitizer (e.g., first ADC 114) in the first input channel to provide multiple first SUT waveforms. Each first SUT waveform includes first digital samples, and first noise introduced by the first digitizer during digitization. In block S213, the second copy of the SUT is repeatedly sampled a second digitizer (e.g., second ADC 124) in the second input channel to provide multiple second SUT waveforms. Each second SUT waveform likewise includes second digital samples, and second noise introduced by the second digitizer during digitization. The first noise introduced by the first digitizer and the second noise introduced by the second digitizer are uncorrelated. That is, the first noise and the second noise are unique to the first and second SUT waveforms, respectively.

The first and second copies of the SUT may be sampled using various techniques involving one or more repetitions of the SUT waveform. For example, the first and second copies of the SUT may be sampled by repeatedly collecting first and second SUT waveforms that span all or part of the repeating waveform pattern of the SUT. Alternatively, the first and second copies of the SUT may be sampled during a single long capture of each of the first and second SUT waveforms, which contains multiple repetitions of all or part of the repeating waveform pattern of the SUT. As another example, the first and second copies may be sampled using equivalent-time sampling by dwelling on different sampling times to capture a subset of samples from different repetitions of each of the first and second SUT waveform at each sampling time. Or, the first and second copies of the SUT may be extracted by over-sampling a single first SUT waveform and a single second SUT waveform, respectively. The manner in which the first and second copies of the SUT are sampled affects how the first and second digital samples are organized into groups, as discussed below with reference to block S215.

In block S214, the first SUT waveforms are paired with the second SUT waveforms, respectively, according to the repeating waveform pattern of the SUT to provide corresponding pairs of first and second digital samples. The pairing is based on timing, such that each pair is consists of first and second SUT waveforms acquired at the same sampling time. For purposes of discussion, "sampling time" may be a discrete instance of time or a narrow time window, and is determined relative to the start of the repeating waveform pattern, or to some other marker within the repeating waveform pattern. To enable the pairing, the first and second digitizers are aligned with one another so that the timing of the first and second SUT waveforms may be matched. For example, the first and second digitizers may be synchronized with a common time base, or they may have independent time bases that are synchronized with one another.

Figure 3:
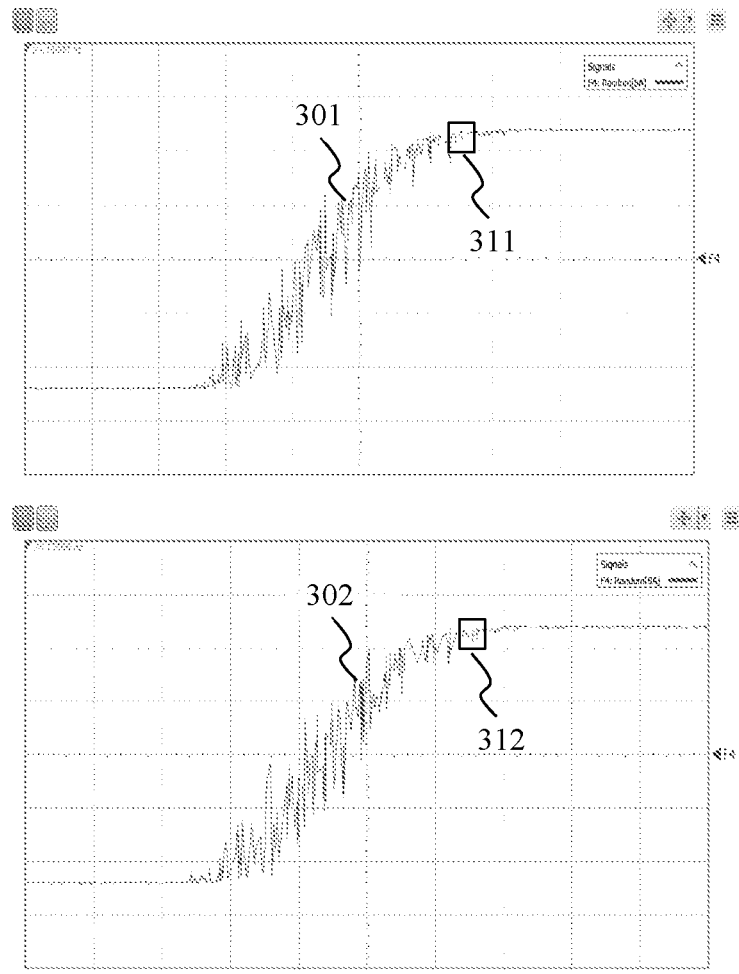
FIG. 3 shows first and second SUT waveforms that are to be paired with one another based on sampling time, according to a representative embodiment.

FIG. 3 shows first and second SUT waveforms that are to be paired with one another based on sampling time, according to a representative embodiment. Traces 301 and 302 respectively show amplitude of the first and second SUT waveforms as a function of time. The first and second digitized samples from the first and second SUT waveforms are collected at the same sampling time, which in the depicted example is a time period indicated by blocks 311 and 312. Notably, both traces 301 and 302 show an extensive amount of increased noise (e.g., jitter) occurring at non-zero portions of the slope. In this case, the noise floor differs at the different times, which generally makes detecting noise introduced by the first and second digitizers difficult according to conventional methods.

In block S215, the pairs of first and second digital samples are organized into groups of sample pairs. The groups correspond to the sampling times relative to the repeating waveform pattern of the SUT, respectively, for which the first and second digital samples are paired. Each group may include N sample pairs. The order in which the first and second digital samples are collected and paired is not important, as long as the pair relationship is maintained. That is, the first and second digital samples may be acquired in a single sweep or multiple sweeps, as discussed above, and be collected in any order, without departing from the scope of the present teachings.

The manner in which the pairs of first and second digital samples are organized into groups depends in part on how the first and second waveforms have been sampled, as discussed above. For example, when the sampling includes repeatedly collecting first and second SUT waveforms that span all or part of the repeating waveform pattern of the SUT, the pairs of first and second digital samples are organized into the groups of sample pairs by aligning the first and second SUT waveforms during the sampling using triggering capability. When the first and second input channels are driven from a common time base, the alignment occurs naturally in that samples resulting from an identical trigger event make up a pair. When channels are driven from independent time bases, the time bases must first by synchronized. Methods for synchronizing multiple time bases are well known to one skilled in the art.

When the sampling includes a single long capture of each of the first and second SUT waveforms, the pairs of first and second digital samples are organized into the groups of sample pairs by aligning the first and second SUT waveforms during post-processing, e.g., by the processing unit 150. That is, sampling times are associated with portions of the first and second SUT waveforms while they are being captured, and these portions may be separated and paired during post-processing based on the associated sampling times. During post processing, the repetitions of the repeating waveform pattern are identified. Groups are composed of all pairs of samples that fall within a narrow time window within the repeating waveform pattern. For example, when the repeating waveform pattern has a period of 1 ns, all the samples that fall within the first 1 ps of this period may be designated the first group, all the samples that fall within the second 1 ps may be designated the second group, and so on, for a total of 1,000 groups.

When the sampling includes dwelling on different sampling times, the captured subsets of samples from the first and second SUT waveforms at each sampling time may be paired and organized into a group during the dwelling at that sampling time.

When over-sampling single first and second SUT waveforms, the sample pairs may be organized into the groups by dividing the over-sampled first SUT waveform and the over-sampled second SUT waveform into short sections by decimation corresponding to the groups. That is, the groups of sample pairs include all digital samples that fall within the short sections of the over-sampled first and second SUT waveforms.

Under certain circumstances, the correct sampling times of the sample pairs are not necessarily known until after the corresponding first and second digital samples have been collected. For example, the correct sampling times may not be known at the time of collection by an oscilloscope that uses a precision timebase to locate final times of the sample pairs. This is not an issue, though, as long as multiple sample pairs can be assigned to the same sampling time or to narrow time window.

In block S216, a covariance of the first and second digital samples is calculated for each group of sample pairs in order to estimate a signal variance of the SUT at the corresponding respective sampling time of the group. That is, the covariance of the first and second digital samples in each group is approximately equal to the signal variance of the SUT for that group.

For purposes of illustration, it may be assumed that the first digital samples ($X_1$) from the first channel organized into a group of sample pairs may be represented by $X_1=S+N_1$, where S is the signal portion of $X_1$, as if the first digitizer were noiseless, and $N_1$ is the noise introduced by the first digitizer. Likewise, the second digital samples ($X_2$) from the second channel organized into the same group of sample pairs may be represented by $X_2=S+N_2$, where S is the signal portion of $X_2$, as if the second digitizer were noiseless, and $N_2$ is the noise introduced by the second digitizer. The covariance of the first and second digital samples ($cov(X_1, X_2)$) for each group therefore may be provided as follows:

$$cov(X_1,X_2)=cov(S+N_1+S+N_2)$$

$$cov(X_1,X_2)=cov(S,S)+cov(S,N_2)+cov(S,N_1)+cov(N_1,N_2)$$

Since the first and second noise $N_1$ and $N_2$ are independent from each other (uncorrelated noise), and are independent from the signal portions S of the first and second digital samples $X_1$ and $X_2$, the covariance between respective pairs of these variables is 0

$$cov(X_1,X_2)=cov(S,S)+0+0+0$$

Accordingly, the covariance of the first and second digital samples $cov(X_1, X_2)$ is approximately equal to the variance of the SUT:

$$cov(X_1,X_2)=var(S)$$

The signal variance var(S) as calculated by the covariance of the first and second digital samples $cov(X_1, X_2)$ is considered a target or desired signal variance of the SUT at the sampling times corresponding to the groups of sample pairs.

In an embodiment, the covariance $cov(X_1, X_2)$ is estimated by first calculating the first mean (u1) of the first digital samples and the second mean (u2) of the second digital samples in each group, and then subtracting the first mean from each of the first digital samples to obtain first residuals and subtracting the second mean from each of the second digital samples to obtain second residuals. The first and second residuals are deviations of the signals from the average values, therefore essentially represent the uncorrelated noise of the first and second digital samples. The first and second residuals in the pairs of first and second digital samples are multiplied together, and the resulting products are summed together and divided by the number of samples (N) making up the group (i.e., the number of sample pairs). For example, the covariance of the first and second digital samples (desired signal variance of the SUT) for each group may be provided as follows, where $X_1$ and $X_2$ are vectors and u1 and u2 are scalers:

$$\mathrm{cov}(X_1, X_2) \approx \frac{1}{N-1} \cdot (X_1 - u1) \cdot (X_2 - u2)$$

Accordingly, the vectors made up of N elements (samples) are adjusted to remove the respective means from the first and second digital samples and multiplied together, element-by-element, and then divided by N−1 for normalization.

In block S217, the first and second digital samples are scaled for each group of sample pairs in order to preserve the mean of the group while adjusting an actual signal variance of the group to match the estimated desired signal variance of the SUT at the corresponding sampling time of the group. In order to scale the first and second digital samples, a scaling factor associated with each group is determined. The scaling factor (SF) is the quotient of the square root of the desired signal variance ($\mathrm{cov}(X_1, X_2)$) and the square root of the actual signal variance var(y), where y is an averaged residual signal of the first and second digital samples with the respective first and second means subtracted out, as discussed above, for each group:

$$y = ((X_1 - u1) + (X_2 - u2))/2.$$

Accordingly, the scaling factor for each group may be provided as follows:

$$SF = \sqrt{\mathrm{cov}(X_1, X_2)} / \sqrt{\frac{1}{N-1}(y_1^2 + y_2^2 + \ldots y_N^2)}$$

Once the scaling factor SF is determined, the averaged residual signal y of the first and second digital samples is multiplied by the scaling factor to provide a modified residual signal (y'), which essentially is the noise as it would appear for the desired signal variance of the SUT. The average of the first and second means ((u1+u2)/2) is then added to the modified residual signal y' for each group to provide modified first and second digital samples with an adjusted variance that matches the desired signal variance ($\mathrm{cov}(X_1, X_2)$). This is a corrected short segment of the SUT waveform at the corresponding sampling time of that group.

In block S218, the groups of sample pairs with the adjusted variances are assembled according to the corresponding sampling times into a reassembled SUT waveform. The reassembled SUT waveform excludes the first and second noise (uncorrelated noise) introduced by the first and second digitizers, respectively. The reassembled SUT waveform is output as a noise reduced measurement of the SUT in block S219, where the reassembled SUT waveform excludes the uncorrelated first and second noise. For example, the reassembled SUT waveform may be displayed to show the waveform pattern of the SUT, e.g., on an oscilloscope display, with no uncorrelated noise added by the test system.

The method shown in FIG. 2 does not require any a priori knowledge about the magnitude or distribution of noise introduced by the first and second digitizers, provided that the first and second digitizers have independent noise. However, the method requires multiple digitizers, as well as means to split or otherwise duplicate the SUT, which adds some complexity and/or expense. In alternative embodiments, however, the SUT waveform may be measured using a single digitizer, where the noise of the single digitizer can be characterized beforehand.

Figure 4:
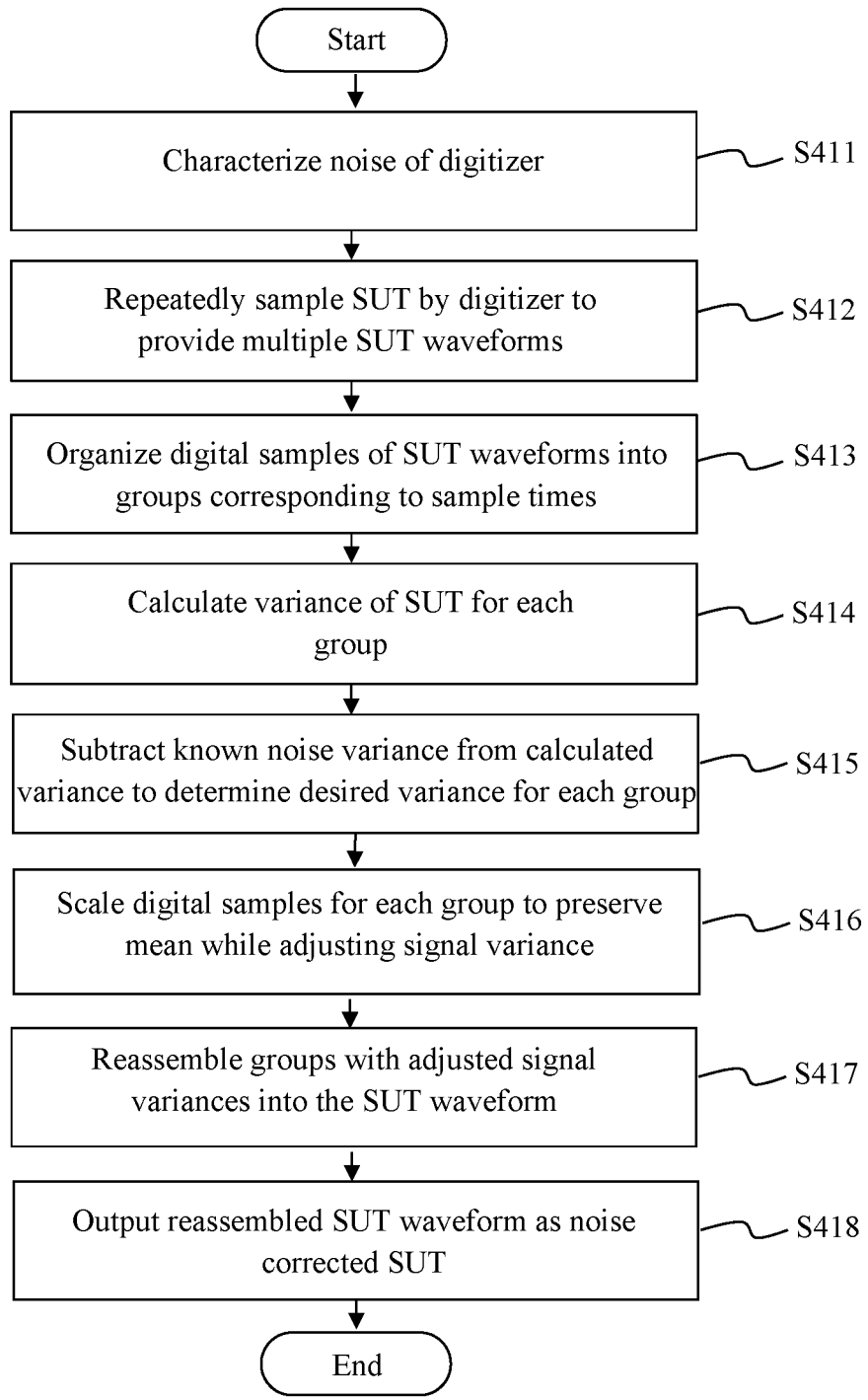
FIG. 4 is a flow diagram illustrating a method of measuring a waveform of a SUT with reduced error in the time domain using a single digitizer, according to a representative embodiment.

In this regard, FIG. 4 is a flow diagram illustrating a method of measuring a waveform of a SUT with reduced error in the time domain using a single digitizer, according to a representative embodiment. The method may be implemented by the processing unit 150, for example, where the method steps are provided as instructions stored in the memory 156 and executable by the processor 155. Again, the SUT has a repeating waveform pattern.

Generally, when using a single digitizer, the same acquisition methodology is used as discussed with reference to FIG. 2, although the collections are from the single digitizer (sampler) instead of a pair of digitizers. In this case, instead of adjusting the variance of each group of samples to be a desired signal variance of the SUT, the group variance is adjusted to remove the known variance (characterized noise) of the digitizer. Adjusting the group variance includes calculating the variance of each group, subtracting the known variance of the digitizer to calculate a signal variance at the sampling time of the group, and then scaling digital samples of the group to achieve the calculated signal variance using substantially the same approach discussed above with regard to scaling digital samples, as discussed in more detail below.

Referring to FIG. 4, the noise of the single digitizer is characterized in block S411. For example, characterizing the noise of the digitizer may include approximating the noise to a first order as simple Gaussian noise with a fixed variance. Alternatively, characterizing the noise may include approximating the noise using a predetermined noise model with variance as a function of a configuration of the digitizer or as a function of a signal level of the SUT. The characterized noise may be stored for subsequent application to the SUT measurements. Techniques for characterizing noise of a digitizer are well known to one skilled in the art. For example, the digitizer may be characterized by performing a self-measurement of the noise when no signal is connected and the channel is properly loaded. Such characterization may need to be done across multiple internal states of the sampler and the digitizer, such as with various levels of internal signal amplification performed, for example.

In block S412, the SUT is repeatedly sampled at the digitizer (e.g., first ADC 114 or second ADC 124) in a corresponding input channel to provide multiple SUT waveforms, which include noise introduced by the digitizer during digitization. Each SUT waveform includes digital samples. As discussed above, the SUT may be sampled using various techniques involving one or more repetitions of the SUT waveform. For example, the SUT may be sampled by repeatedly collecting SUT waveforms that span all or part of the repeating waveform pattern of the SUT. Alternatively, the SUT may be sampled during a single long capture of the SUT waveform containing multiple repetitions of all or part of the repeating waveform pattern. As another example, the SUT may be sampled using equivalent-time sampling by dwelling on different sampling times to capture a subset of samples from different repetitions of the SUT waveform at each sampling time. Or, the SUT may be extracted by over-sampling a single SUT waveform.

In block S413, the digital samples are organized into groups, which correspond to sampling times within the repeating waveform pattern of the SUT. Each group includes multiple digital samples (N samples) corresponding the particular sampling time.

In block S414, for each group of the digital samples, a variance of the SUT is calculated for the group at the corresponding sampling time group. The variance of the SUT may be calculated as follows, where X is the group of N individual samples $x_i$, and u is the mean of the group:

$$\text{var}(X) = \frac{1}{N-1}\left((x_1 - u)^2 + (x_2 - u)^2 \ldots (x_N - u)^2\right)$$

In block S415, for each group, a known noise variance corresponding to the noise introduced by the digitizer, as characterized in block S411, is subtracted from the calculated variance of the SUT to determine a desired signal variance of the SUT for each group. The known noise variance is derived from the characterized noise of the digitizer from block S411.

In block S416, the digital samples for each group are scaled to preserve a mean of the group while adjusting the actual signal variance to match the determined signal variance of the SUT at the corresponding sampling time of the group. In order to scale the digital samples, a scaling factor associated with each group is determined. The scaling factor is the quotient of the square root of the desired signal variance of the SUT (from block S415) and the square root of the actual signal variance of the SUT (from block S414).

Once the scaling factor (SF) is determined, a scaled (corrected) group of samples (X') can be calculated by removing the mean u from the samples, applying the scaling factor (SF), and then adding back the mean u, indicated as follows:

$$X' = u + SF(X - u)$$

In block S417, the groups of the digital samples with the adjusted group signal variances are assembled as a reassembled SUT waveform, without the noise introduced by the digitizer. The reassembled SUT waveform is output as a noise reduced measurement of the SUT in block S418, where the reassembled SUT waveform excludes the noise of the test system. For example, the reassembled SUT waveform may be displayed to show the pattern of the SUT, e.g., on an oscilloscope display, with no noise added by the test system.

The various embodiments work for any time-domain waveform as the SUT, including voltage, current, optical, time-interval error, and phase error, for example. All errors that are uncorrelated between multiple digitizers are removed, including voltage noise, time jitter, and spurious distortion, for example.

When a SUT is connected to an oscilloscope or other instrument providing digitization through a probe, for example, two probes can be used, one for each of the first and second copies of the digitized SUT. Noise contributed by the two probes is uncorrelated to each other, and will therefore also be removed by the embodiments described herein.

When the SUT comprises an optical waveform, the SUT may be split optically into the first and second copies, and thus the first and second input channels have separate optical-electrical converters following the first and second amplifiers, respectively. In this case, the uncorrelated noise that is removed includes noise associated with the photodetectors of the optical-electrical converters, as well as the samplers and the ADCs.

Also, while the embodiments are directed to removing all added noise of the digitizer(s), there are some applications that endeavor to reduce the noise to a specific amount. Some compliance testing applications, for example, want the digitized waveform to mimic the same signal-to-noise ratio (SNR) as that of a standard receiver. In this case, the scaling factors may be adjusted to leave a certain amount of added noise.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of measuring in the time domain a waveform of a signal under test (SUT) with reduced error, the SUT waveform having a repeating waveform pattern, the method comprising:

repeatedly sampling a first copy of the SUT at a first digitizer to provide a plurality of first SUT waveforms including first noise introduced by the first digitizer, wherein each first SUT waveform comprises first digital samples;

repeatedly sampling a second copy of the SUT at a second digitizer to provide a plurality of second SUT waveforms including second noise introduced by the second digitizer, wherein each second SUT waveform comprises second digital samples, wherein the first noise and the second noise are uncorrelated;

pairing the first SUT waveforms with the second SUT waveforms, respectively, according to the repeating waveform pattern to provide corresponding pairs of first and second digital samples;

organizing the pairs of first and second digital samples into groups of sample pairs, each group corresponding to a respective sampling time relative to a start of the repeating waveform pattern, respectively;

calculating covariances of the first and second digital samples of the groups, respectively, to estimate desired signal variances of the SUT at the respective sampling times of the groups;

scaling the first and second digital samples to preserve means of the groups while adjusting variances of the groups, respectively, to match the estimated desired signal variances of the SUT at the respective sampling times of the groups;

assembling the groups of sample pairs with the adjusted variances of the groups into a reassembled waveform of the SUT, without the first and second noise; and outputting the reassembled SUT waveform as a noise reduced measurement of the SUT.

2. The method of claim 1, wherein the first and second digitizers are synchronized with a common time base.

3. The method of claim 1, wherein the first and second digitizers have independent time bases that are synchronized with one another.

4. The method of claim 1, wherein each of the first SUT waveforms and the second SUT waveforms spans at least a portion of the repeating waveform pattern, and wherein organizing the pairs of first and second digital samples into the groups of sample pairs corresponding to the respective sampling times comprises aligning the first and second SUT waveforms using a triggering capability.

5. The method of claim 1, wherein each of the first SUT waveforms and the second SUT waveforms are collected as a single long capture of the repeating waveform pattern, and wherein organizing the pairs of first and second digital samples into the groups of sample pairs corresponding to the respective sampling times comprises aligning the first and second SUT waveforms during post-processing.

6. The method of claim 1, wherein organizing the pairs of first and second digital samples into the groups of sample pairs corresponding to the respective sampling times comprises using a common time base to dwell at each respective time within the repeating waveform pattern and collecting the pairs of first and second digital samples into the groups for each respective sampling time at once.

7. The method of claim 1, wherein organizing the pairs of first and second digital samples into the groups of sample pairs corresponding to the respective sampling times comprises over-sampling one of the first SUT waveforms and one of the second SUT waveforms, and dividing the over-sampled first SUT waveform and the over-sampled second SUT waveform into short sections, and wherein the groups of sample pairs comprise digital samples that fall within a short section of one of the over-sampled first and second SUT waveforms.

8. A system for measuring in the time domain a waveform of a signal under test (SUT) with reduced error, the SUT waveform having a repeating waveform pattern, the system comprising:

a first channel configured to receive a first copy of the SUT, the first channel comprising a first analog to digital converter (ADC) configured to repeatedly sample the first copy of the SUT to provide a plurality of first SUT waveforms including first noise introduced by the first ADC, wherein each first SUT waveform comprises first digital samples;

a second channel configured to receive a second copy of the SUT, the second channel comprising a second ADC configured to repeatedly sample the second copy of the SUT to provide a plurality of second SUT waveforms including second noise introduced by the second ADC, wherein each second SUT waveform comprises second digital samples, and wherein the first noise and the second noise are uncorrelated;

a processor; and a non-transitory memory for storing instructions that, when executed by the processor, cause the processor to:

pair the first SUT waveforms with the second SUT waveforms, respectively, according to the repeating waveform pattern to provide corresponding pairs of first and second digital samples;

organize the pairs of first and second digital samples into groups of sample pairs, each group corresponding to a respective sampling time relative to a start of the repeating waveform pattern, respectively;

calculate covariances of the first and second digital samples of the groups, respectively, to estimate desired signal variances of the SUT at the respective sampling times of the groups;

scale the first and second digital samples to preserve means of the groups while adjusting variances of the groups, respectively, to match the estimated desired signal variances of the SUT at the respective sampling times of the groups;

assemble the groups of sample pairs with the adjusted variances of the groups into a reassembled waveform of the SUT, without the first and second noise; and output the reassembled SUT waveform as a noise reduced measurement of the SUT.

9. The system of claim 8, wherein the first ADC and the second ADC are synchronized with a common time base.

10. The system of claim 8, wherein the first ADC and the second ADC have independent time bases that are synchronized with one another.

11. The system of claim 8, wherein each of the first SUT waveforms and the second SUT waveforms spans at least a portion of the repeating waveform pattern, and wherein the instructions cause the processor to organize the pairs of first and second digital samples into the groups of sample pairs corresponding to the respective sampling times by aligning the first and second SUT waveforms using a triggering capability.

12. He system of claim 8, wherein each of the first SUT waveforms and the second SUT waveforms are collected as a single long capture of the repeating waveform pattern, and wherein the instructions cause the processor to organize the pairs of first and second digital samples into the groups of sample pairs corresponding to the respective sampling times by aligning the first and second SUT waveforms during post-processing.

13. The system of claim 8, wherein the instructions cause the processor to organize the pairs of first and second digital samples into the groups of sample pairs corresponding to the respective sampling times by using a common time base to dwell at each respective time within the repeating waveform pattern and collecting the pairs of first and second digital samples into the groups of sample pairs for each respective sampling time at once.

14. The system of claim 8, wherein the instructions cause the processor to organize the pairs of first and second digital samples into the groups of sample pairs corresponding to the respective sampling times by over-sampling one of the first SUT waveforms and one of the second SUT waveforms, and dividing the over-sampled first SUT waveform and the over-sampled second SUT waveform into short sections, and wherein the groups of sample pairs comprise digital samples that fall within a short section of one of the over-sampled first and second SUT waveforms.

15. A non-transitory computer readable medium storing instructions for measuring in the time domain a waveform of a signal under test (SUT) having a repeating waveform pattern using a first analog to digital converter (ADC)

configured to repeatedly sample a first copy of the SUT to provide a plurality of first SUT waveforms including first noise introduced by the first ADC, and a second ADC configured to repeatedly sample a second copy of the SUT to provide a plurality of second SUT waveforms including second noise introduced by the second ADC, wherein, when executed by a processor, the instructions cause the processor to:

- pair the first SUT waveforms with the second SUT waveforms, respectively, according to the repeating waveform pattern to provide corresponding pairs of first digital samples of the first SUT waveform and second digital samples of the second SUT waveform;
- organize the pairs of first and second digital samples into groups of sample pairs, each group corresponding to a respective sampling time relative to a start of the repeating waveform pattern, respectively;
- calculate covariances of the first and second digital samples of the groups, respectively, to estimate desired signal variances of the SUT at the respective sampling times of the groups;
- scale the first and second digital samples to preserve means of the groups while adjusting variances of the groups, respectively, to match the estimated desired signal variances of the SUT at the respective sampling times of the groups;
- assemble the groups of sample pairs with the adjusted variances of the groups into a reassembled waveform of the SUT, without the first and second noise; and
- output the reassembled SUT waveform as a noise reduced measurement of the SUT.

16. The non-transitory computer readable medium of claim 15, wherein each of the first SUT waveforms and the second SUT waveforms spans at least a portion of the repeating waveform pattern, and
wherein the instructions cause the processor to organize the pairs of first and second digital samples into the groups of sample pairs corresponding to the respective sampling times by aligning the first and second SUT waveforms using a triggering capability.

17. The non-transitory computer readable medium of claim 15, wherein each of the first SUT waveforms and the second SUT waveforms are collected as a single long capture of the repeating waveform pattern, and
wherein the instructions cause the processor to organize the pairs of first and second digital samples into the groups of sample pairs corresponding to the respective sampling times by aligning the first and second SUT waveforms during post-processing.

18. The non-transitory computer readable medium of claim 15, wherein the instructions cause the processor to organize the pairs of first and second digital samples into the groups of sample pairs corresponding to the respective sampling times by using a common time base to dwell at each respective time within the repeating waveform pattern and collecting the pairs of first and second digital samples into the groups of sample pairs for each respective sampling time at once.

19. The non-transitory computer readable medium of claim 15, wherein the instructions cause the processor to organize the pairs of first and second digital samples into the groups of sample pairs corresponding to the respective sampling times by over-sampling one of the first SUT waveforms and one of the second SUT waveforms, and dividing the over-sampled first SUT waveform and the over-sampled second SUT waveform into short sections, and
wherein the groups of sample pairs comprise digital samples that fall within a short section of one of the over-sampled first and second SUT waveforms.

* * * * *